United States Patent [19]

Levi

[11] Patent Number: 4,734,749

[45] Date of Patent: Mar. 29, 1988

[54] SEMICONDUCTOR MESA CONTACT WITH LOW PARASITIC CAPACITANCE AND RESISTANCE

[75] Inventor: Clifford A. Levi, Billerica, Mass.

[73] Assignee: Alpha Industries, Inc., Woburn, Mass.

[21] Appl. No.: 251,912

[22] Filed: Apr. 7, 1981

Related U.S. Application Data

[60] Continuation of Ser. No. 878,086, Feb. 15, 1978, abandoned, which is a continuation of Ser. No. 512,443, Oct. 7, 1974, abandoned, which is a continuation of Ser. No. 265,260, Jun. 22, 1972, abandoned, which is a division of Ser. No. 19,085, Mar. 12, 1970, abandoned, and a continuation-in-part of Ser. No. 835,402, Jun. 23, 1969, abandoned.

[51] Int. Cl.⁴ .................................... H01L 29/48
[52] U.S. Cl. .................................... 357/15; 357/52; 357/56; 357/74
[58] Field of Search .................. 357/13, 15, 52, 56, 357/68, 74

[56] References Cited

U.S. PATENT DOCUMENTS

| | | | |
|---|---|---|---|
| 2,894,183 | 7/1959 | Fermanian | 357/74 |
| 2,930,722 | 3/1960 | Ligenza | 357/56 |
| 3,001,113 | 9/1961 | Mueller | 357/74 |
| 3,030,557 | 4/1962 | Dermit | 357/74 |
| 3,160,534 | 12/1964 | Oroshnik | 357/74 |
| 3,197,608 | 7/1965 | Ingraham | 357/74 |
| 3,241,011 | 3/1966 | DeMille et al. | 357/74 |
| 3,242,061 | 3/1966 | Armstrong | 357/74 |
| 3,266,137 | 8/1966 | DeMille et al. | 357/74 |
| 3,280,388 | 10/1966 | Kadelburg | 357/74 |
| 3,339,274 | 9/1967 | Saia et al. | 357/74 |
| 3,354,258 | 11/1967 | Saia et al. | 357/74 |
| 3,476,984 | 11/1969 | Tibol | 357/15 |
| 3,537,889 | 11/1970 | Mets et al. | 357/56 |

OTHER PUBLICATIONS

P. Totta, "Depositing Pd Ohmic Contact Layers on Semiconductor Devices", IBM Tech. Discl. Bull., vol. 11, #3, Aug. 1968, p. 216.

Primary Examiner—Joseph E. Clawson, Jr.
Attorney, Agent, or Firm—Charles Hieken

[57] ABSTRACT

Method of manufacturing silicon mesa diodes from a wafer of silicon. The surface of the wafer is coated with a first layer of silicon nitride and a second layer of silicon oxide. By masking and etching procedures, silicon nitride is left only on the portions of the surface defining the mesas to be formed. The wafer is etched to form the mesas and then treated to form a passivating silicon oxide coating at all the exposed surfaces of the wafer. The silicon nitride is removed from the upper surfaces of the mesas and metal contacts are applied to these upper surfaces. The wafer is subsequently divided into discrete dice, each containing a mesa, and the dice are mounted in suitable enclosures.

1 Claim, 11 Drawing Figures

SEMICONDUCTOR MESA CONTACT WITH LOW PARASITIC CAPACITANCE AND RESISTANCE

CROSS-REFERENCE TO RELATED APPLICATION

This is a continuation of application Ser. No. 878,086, filed Feb. 15, 1978, which is a continuation of application Ser. No. 512,443, filed Oct. 7, 1974, which is a continuation of Ser. No. 265,620, filed 6-22-72 which is a division of application Ser. No. 19,085, filed Mar. 12, 1970, a continuation-in-part of Ser. No. 835,402, filed June 23, 1969 all abandoned.

BACKGROUND OF THE INVENTION

This invention relates to semiconductor electrical translating devices. More particularly, it is concerned with methods of producing mesa diodes having passivated junctions.

The so-called mesa structure has been widely used in certain types of semiconductor diodes. In devices of this type having a P-N junction a mesa or pedestal of semiconductor material extends above the bulk of the body of semiconductor material, and the P-N junction is disposed within the mesa generally parallel to the top surface of the mesa. The edges of the junction at the edge surfaces of the mesa may be protected by a passivating coating as of silicon oxide. For certain applications mesa diodes have advantages over devices of the so-called planar structure in that parasitic capacitance and resistance typically are less and problems inherent in a curved junction are eliminated.

A large number of mesa devices are usually produced simultaneously from a single wafer of semiconductor material typically silicon. For P-N junction devices the junction is formed parallel to the major surfaces of the wafer as by diffusing an appropriate conductivity type imparting material into a surface of the wafer. By employing well-known photoresist masking and etching procedures, the wafer is masked with resistant material and etched to remove the silicon of the diffused region except that which is protected by resistant material, thus forming the mesas. After the mesas are produced, a layer of silicon oxide is formed on the exposed surfaces of the wafer including the surface edges of the mesas. Again employing known photoresist masking and etching procedures, openings are formed in the silicon oxide at the upper surfaces of the mesas. Conductive contacts are applied to the exposed areas of the upper surfaces by employing known metalization techniques. The remaining silicon oxide serves as a passivating layer protecting the edges of the junctions at the edge surfaces of the mesas.

The procedure employed in forming the openings in the silicon oxide layer to expose the upper surfaces of the mesas and thus determine the contact areas causes certain difficulties. The mask employed to define the openings must be carefully aligned with respect to the mesa structure in the wafer. If the entire upper surface of the mesa is not exposed and then metalized, parasitic series resistance through the device is increased. The photoresist material may be too thin at the corners or at the edge surfaces of the mesas with the result that some passivating silicon oxide may be removed from these regions during the etching step. In certain devices a conductive heat sink is mounted on the upper surface of the mesa. If any silicon oxide remains on the upper surface of the mesa, thermal conductivity between the mesa and heat sink is reduced.

SUMMARY OF THE INVENTION

The method of producing mesa devices in accordance with the invention eliminates the presence of silicon oxide from the upper surfaces of the mesas and the necessity for employing photoresist masking procedures for defining the areas of the surfaces to be metalized. The method employs a body of semiconductor material having a surface. A layer of protective material is placed on a predetermined area of the surface thereby delineating a mesa. The body of semiconductor material is subjected to an etching medium capable of dissolving the semiconductor material but not the protective material in order to remove exposed semiconductor material, thereby forming a mesa extending above the newly exposed surface of the bulk region of the body. The mesa has edge surfaces between the predetermined area of the surface and the exposed surface of the bulk region. An adherent non-conductive coating is formed on the edge surfaces of the mesa. The assembly is subjected to an etching medium capable of dissolving the protective material but not the other materials of the assembly to remove the layer of protective material and expose the predetermined area of the surface, which is now the upper surface of the mesa. A layer of conductive material is then placed on the predetermined area of the surface.

BRIEF DESCRIPTION OF THE DRAWINGS

Additional objects, features, and advantages of the method of the invention will be apparent from the following detailed discussion and the accompanying drawings wherein:

Although several hundred devices may be fabricated simultaneously in a single wafer of semiconductor material, for purposes of illustration FIGS. 1-10 show portions of four devices being fabricated in a fragment of a wafer.

Figure 1:
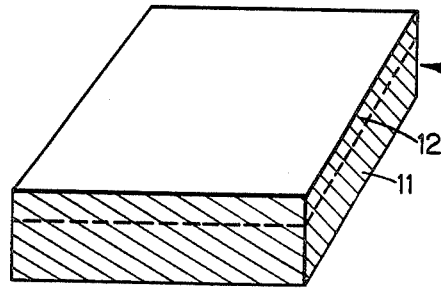
FIGS. 1-10 are perspective views in cross-section of a portion of a wafer of semiconductor material illustrating various stages in the fabrication of mesa diodes in accordance with the invention.

Because of the extremely small size of various portions of the elements illustrated in the drawings, some of the dimensions of many of the elements have been exaggerated with respect to other dimensions. It is believed that greater clarity of presentation is thereby obtained despite consequent distortion of elements in relation to their actual physical appearance.

DETAILED DESCRIPTION OF THE INVENTION

FIG. 1 illustrates a fragment of a wafer of silicon 10 having opposed, flat, major surfaces. For illustrative purposed the bulk region 11 of the wafer is of one conductivity type, for example, N-type. A surface layer 12 is of the opposite conductivity type, P-type, and forms a P-N junction with the bulk region. The layer 12 may be formed as by diffusing an appropriate conductivity type imparting material into the wafer to a depth of about 1 to 15 microns.

Figure 2:
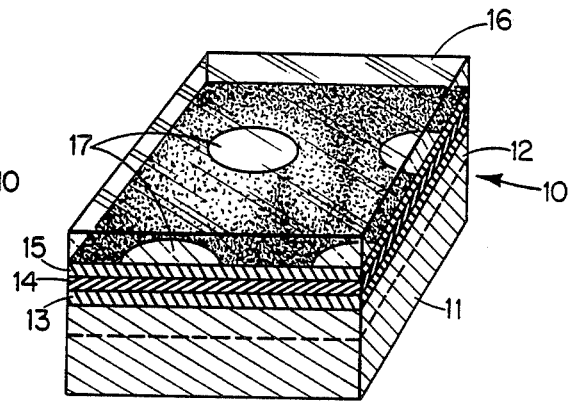

An adherent layer of silicon nitride 13 is deposited onto the surface of the layer as shown in FIG. 2. The layer of silicon nitride is approximately 1500 angstrom units thick and may be deposited as by sputtering or by the nitridation of silane using ammonia.

An adherent layer of silicon oxide 14 is deposited over the layer of silicon nitride 13. The silicon oxide layer which is approximately 7,000 angstrom units thick may be formed by the pyrolytic reaction of silane with oxygen or by decomposition of an organo-silicate.

A layer of photosensitive resistant material 15 of the type employed in known masking and etching techniques for forming openings in silicon oxide is placed over the surface of the silicon oxide layer 14. Any of the well-known photosensitive polymerizable resistant materials known in the art may be employed. The resistant material is applied as by spinning on or by spraying.

The layer of photosensitive resistant material 15 is dried and then selectively exposed to ultraviolet light through a mask 16. The mask is of a transparent material, typically glass, and portions of one surface are rendered opaque in a particular predetermined pattern so that the transparent regions 17 conform to the pattern of the mesas to be formed in the wafer. The mask is fabricated by employing known photolithographic techniques which enable the pattern to be defined with a high degree of precision.

Figure 3:
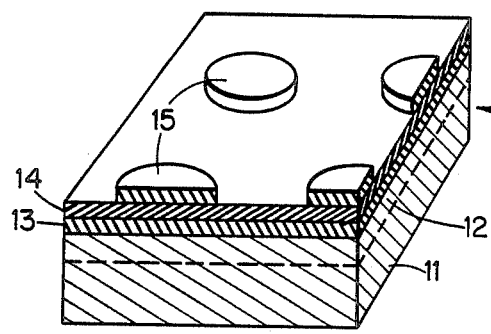

The masked wafer is subjected to ultraviolet light, polymerizing the portions of the resistant material underlying the transparent regions of the mask. Then the mask is removed and the wafer is rinsed in a suitable developing solution which washes away the portions of the resistant material which were under the opaque regions of the mask and thus not exposed to the ultraviolet light. The assembly may then be baked to further polymerize and harden the remaining resistant material 15 which conforms to the pattern for the mesas. The resulting assembly is illustrated in FIG. 3.

Next, the assembly is treated to remove the portions of the silicon oxide layer 14 not protected by the resistant material 15. The wafer is immersed in a solution of buffered hydrofluoric acid for a period of about 4 minutes. This etching solution dissolves silicon oxide but does not attack silicon nitride or other materials of the assembly.

Figure 4:
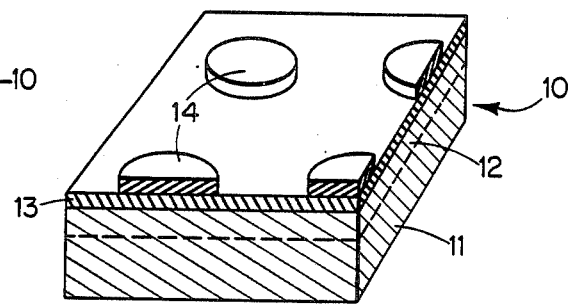

Following the etching treatment and rinsing of the assembly, the remaining resistant material is removed by dissolving in a suitable solvent. As can be seen from FIG. 4, the remaining silicon oxide 14 conforms to the pattern of the mesas to be formed.

Next, the wafer is immersed in a solution of orthophosphoric acid and water at a temperature of about 185° C. for a period of 20 minutes. This solution dissolves silicon nitride but does not attack silicon oxide or silicon. Thus, the layer of silicon nitride is removed except for the portions protected by the silicon oxide 14.

Figure 5:
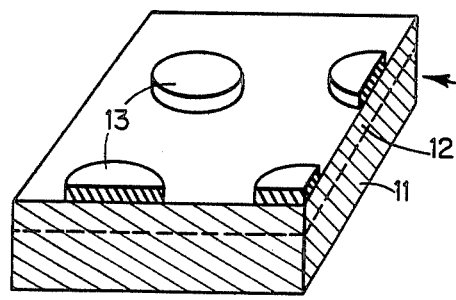

After the orthophosphoric acid treatment, the wafer is re-immersed in the buffered hydrofluoric acid etching solution to dissolve away the remaining portions of the silicon oxide layer. The resulting wafer with silicon nitride 13 remaining only on the surface in the pattern delineating the mesas to be formed is illustrated in FIG. 5.

Figure 6:
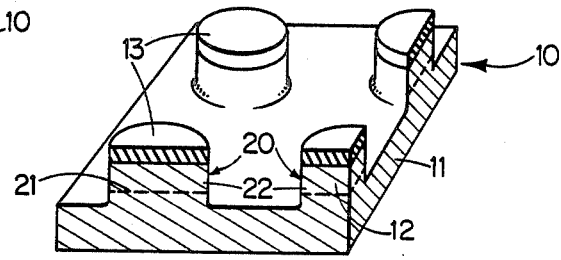

The wafer is then immersed in a solution of nitric and hydrofluoric acids. This solution dissolves silicon but does not attack silicon nitride. The wafer is immersed for a period of time sufficient to etch the wafer to a depth of about 2 to 100 microns depending upon the thickness of the diffused layer 12 and the particular device being fabricated. Thus, the diffused layer 12 of P-type silicon is removed, except for those portions underlying the protective silicon nitride 13, exposing the region 11 of N-type silicon. The resulting structure as illustrated in FIG. 6 includes a plurality of mesas 20 extending above the newly exposed surface of the N-type region 11. Each mesa includes a P-N junction 21 parallel to the upper surface of the mesa and having its edges in the edge surfaces 22 of the mesa.

Figure 7:
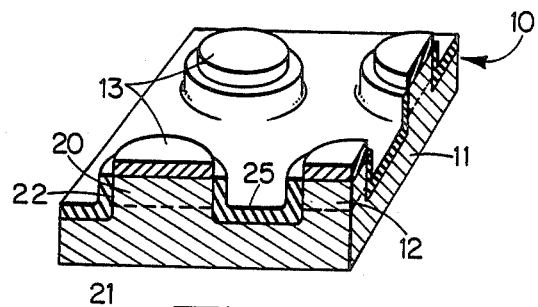

The wafer is then treated in a wet oxygen atmosphere at a temperature of about 1000° C. for about 20 minutes. As is well known, under these conditions the exposed silicon reacts with the oxygen to form a passivating insulating coating of thermally grown silicon oxide 25 on the unprotected surfaces of the wafer. As shown in FIG. 7, the adherent silicon oxide coating 25 protects all the edge surfaces 22 of the mesas 20, including the edges of the P-N junctions 21, up to the upper surface covered with silicon nitride 13. The oxide coating 25 may be approximately 4,000 angstrom units thick.

Figure 8:
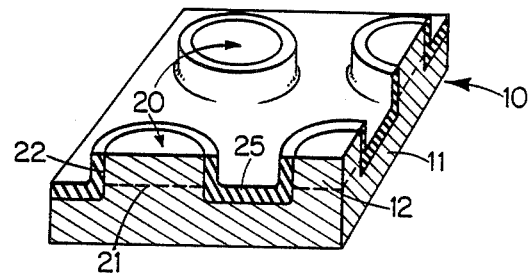

The wafer is re-immersed in the orthophosphoric acid solution to dissolve away the remaining portions of the silicon nitride layer 13. The resulting wafer is illustrated in FIG. 8.

Figure 9:
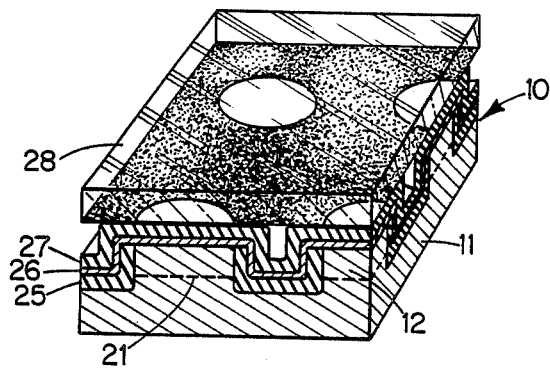

Next, a layer of conductive material is applied to the upper surface of each mesa 20. A precisely defined metal contact may be formed by the electroless plating of nickel on the exposed silicon. Alternatively, a contact may be formed by depositing a layer of conductive material over the entire upper surface of the wafer and then employing photoresist masking and etching procedures to remove the conductive material from all but the upper surfaces of the mesas. For example, as illustrated in FIG. 9, a layer of conductive material 26 consisting of a film of chromium approximately 500 angstrom units thick and a layer of gold approximately 5000 angstrom units thick may be deposited on the upper surface of the wafer by evaporation techniques.

A layer of photosensitive resistant material 27 which may be of the same type as that previously employed is placed over the surface of the layer of conductive material and then dried. A mask 28 is placed over the resistant material and positioned by noting the structure of the mesas so that the transparent regions of the mask are aligned with the mesa pattern. The mask 28 may be the same mask as that previously employed, or it may have sightly smaller transparent regions in order to compensate for the reduction in diameter occurring during mesa etching.

Figure 10:
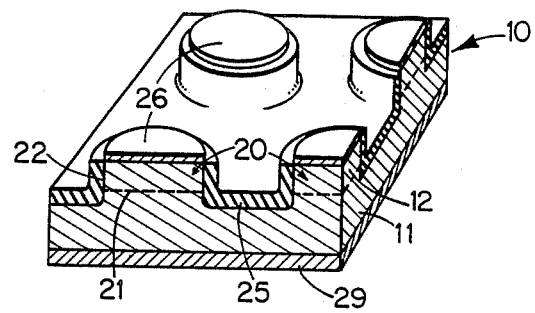

The masked wafer is subjected to ultraviolet light, polymerizing the portions of the photosensitive resistant material underlying the transparent regions of the mask. The mask is removed and the assembly is rinsed in a developing solution to wash away the resistant material which was not exposed to light. The wafer is then treated in a series of suitable etching solutions to successively remove the various metals constituting the conductive layer, and leave only that portion 26 contacting the upper surface of the mesa. The resulting wafer, after the remaining resistant material is removed, is illustrated in FIG. 10.

Because of the process employed, there is never any silicon oxide on the upper surface of a mesa 20 and, therefore, there is no problem of parasitic series resistance or capacitance between the conductive contact 26 and the silicon of the upper surface of the mesa caused by the presence of silicon oxide. The assembly is not subjected to any treatment which attacks silicon oxide after the silicon oxide coating has been formed over the edges of the junction. Thus, the passivating silicon oxide coating 25 is not susceptible to damage during an etching step because of imperfections in masking of the edge surfaces, and the coating remains uniform.

Figure 11:
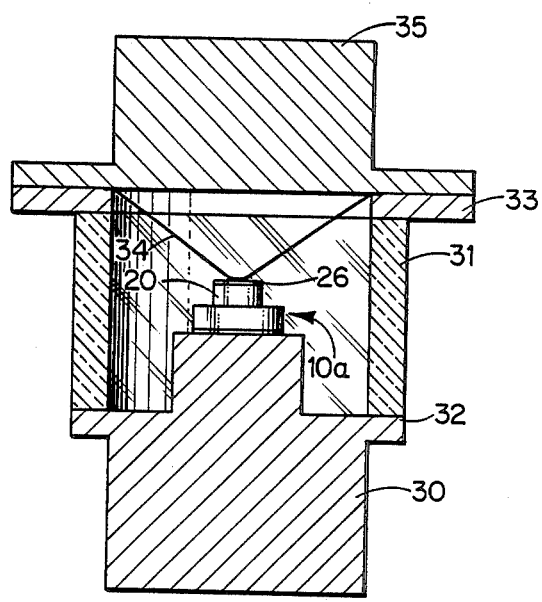
FIG. 11 is an elevational view in cross-section of a semiconductor device incorporating a semiconductor element having a mesa structure and fabricated in accordance with the method of the invention.

The under surface of the wafer is coated with a conductive layer 29, as by depositing a film of chromium and a layer of gold as previously described. Then, the wafer is divided into a plurality of discrete elements, each containing a mesa, by scribing and breaking or by sawing the wafer between the mesas. Each individual element, or die 10a, may be mounted in a suitable enclosure, for example, as illustrated in FIG. 11. The enclosure shown includes a conductive base member 30 on which the die 10a is mounted. A cylindrical tube 31 of insulating material is sealed to a flange 32 on the base member and also to a conductive ring member 33. The ends of a gold ribbon 34 are attached to the ring member 33 and the central portion is bonded to the metal contact 26 on the upper surface of the mesa 20. A conductive cap 35 is welded to the ring member 33 to complete the hermetically sealed semiconductor diode.

As shown and described for illustrative purposes, the devices fabricated in accordance with the method of the invention are P-N junction devices. The method may also be employed in the manufacture of Schottky barrier devices in which all portions of the bulk region and the mesas are of the same conductivity type. For devices of this type the conductive material applied to the upper surfaces of the mesas must be a metal which forms a barrier junction with the silicon and not an ohmic contact, for example molybdenum.

While there has been shown and described what is considered a preferred embodiment of the present invention, it will be obvious to those skilled in the art that various changes and modifications may be made therein without departing from the invention as defined by the appended claims.

What is claimed is:

1. A mesa semiconductor device comprising,
  body of silicon semiconductor material having a top surface and edge surfaces defining a mesa of height within the range of 2-100 microns,
  the entire area of said edge surfaces being coated with a thermally grown passivating insulating silicon oxide layer,
  said top surface being entirely covered with a nitride,
  whereby said nitride may be removed by etching said device with phosphoric acid without removing said thermally grown passivating insulating silicon oxide layer so that said entire top surface may then receive a conducting layer establishing one of ohmic contact and a barrier junction with said entire top surface.

* * * * *